United States Patent
Iwamoto et al.

(10) Patent No.: US 11,360,391 B2
(45) Date of Patent: Jun. 14, 2022

(54) TARGET SUPPLY DEVICE, EXTREME ULTRAVIOLET LIGHT GENERATING APPARATUS, AND ELECTRONIC DEVICE MANUFACTURING METHOD

(71) Applicant: Gigaphoton Inc., Tochigi (JP)

(72) Inventors: Fumio Iwamoto, Oyama (JP); Yutaka Shiraishi, Oyama (JP); Tsukasa Hori, Oyama (JP)

(73) Assignee: Gigaphoton Inc., Tochigi (JP)

( * ) Notice: Subject to any disclaimer, the term of this patent is extended or adjusted under 35 U.S.C. 154(b) by 48 days.

(21) Appl. No.: 16/925,567

(22) Filed: Jul. 10, 2020

(65) Prior Publication Data

US 2020/0341383 A1    Oct. 29, 2020

Related U.S. Application Data

(63) Continuation of application No. PCT/JP2018/005992, filed on Feb. 20, 2018.

(51) Int. Cl.
*G03F 7/20* (2006.01)
*H05G 2/00* (2006.01)

(52) U.S. Cl.
CPC ......... *G03F 7/70033* (2013.01); *H05G 2/006* (2013.01); *H05G 2/008* (2013.01)

(58) Field of Classification Search
CPC .................................................. G03F 7/70033
See application file for complete search history.

(56) References Cited

U.S. PATENT DOCUMENTS

| 2013/0221587 A1 | 8/2013 | Shiraishi et al. |
| 2014/0042653 A1 | 2/2014 | Ueno |
| 2017/0053780 A1 | 2/2017 | Iwamoto et al. |

FOREIGN PATENT DOCUMENTS

| JP | 2013201118 A | 10/2013 |
| JP | 2014035948 A | 2/2014 |
| WO | 2016001973 A1 | 1/2016 |

OTHER PUBLICATIONS

International Search Report issued in PCT/JP2018/005992; dated Apr. 17, 2018.
Written Opinion issued in PCT/JP2018/005992 dated Apr. 17, 2018.

*Primary Examiner* — Michelle M Iacoletti
(74) *Attorney, Agent, or Firm* — Studebaker & Brackett PC

(57) ABSTRACT

A target supply device includes a tank body portion holding a target substance; a communication portion connected to the tank body portion and including a filter that filters the melted target substance and a nozzle that discharges the target substance having passed through the filter; a main heater that heats the tank body portion; a sub-heater that heats the communication portion; and a control unit, the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

16 Claims, 8 Drawing Sheets

TARGET SUPPLY DEVICE, EXTREME ULTRAVIOLET LIGHT GENERATING APPARATUS, AND ELECTRONIC DEVICE MANUFACTURING METHOD

CROSS-REFERENCE TO RELATED APPLICATIONS

The present application is a continuation application of International Application No. PCT/JP2018/005992 filed on Feb. 20, 2018, the entire contents of which are hereby incorporated by reference.

BACKGROUND

1. Technical Field

The present disclosure relates to a target supply device, an extreme ultraviolet light generating apparatus, and an electronic device manufacturing method.

2. Related Art

Recently, miniaturization of semiconductor processes has involved rapidly increasing miniaturization of transfer patterns for use in photolithography of the semiconductor processes. In the next generation, microfabrication at 20 nm or less will be required. Thus, development of an exposure device is expected including a combination of an apparatus for generating extreme ultraviolet (EUV) light having a wavelength of about 13 nm and reduced projection reflective optics.

Three types of extreme ultraviolet light generating apparatuses have been proposed: an LPP (Laser Produced Plasma) type apparatus using plasma generated by irradiating a target substance with a laser beam, a DPP (Discharge Produced Plasma) type apparatus using plasma generated by electric discharge, and an SR (Synchrotron Radiation) type apparatus using synchrotron radiation light.

LIST OF DOCUMENTS

Patent Documents

Patent Document 1: US Published Patent Application No. 2017/053780

SUMMARY

A target supply device according to one aspect of the present disclosure may include a tank body portion holding a target substance; a communication portion connected to the tank body portion and including a filter configured to filter the target substance in a melted state and a nozzle configured to discharge the target substance having passed through the filter; a main heater configured to heat the tank body portion; a sub-heater configured to heat the communication portion; and a control unit, the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

An extreme ultraviolet light generating apparatus according to one aspect of the present disclosure may include a chamber in which a target substance supplied to an internal space is irradiated with a laser beam to generate extreme ultraviolet light; and a target supply device configured to supply the target substance into the chamber, the target supply device including a tank body portion holding the target substance, a communication portion connected to the tank body portion and including a filter configured to filter the target substance in a melted state and a nozzle configured to discharge the target substance having passed through the filter, a main heater configured to heat the tank body portion, a sub-heater configured to heat the communication portion, and a control unit, the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

An electronic device manufacturing method according to one aspect of the present disclosure may include generating extreme ultraviolet light with an extreme ultraviolet light generating apparatus; outputting the extreme ultraviolet light to an exposure device; and exposing the extreme ultraviolet light onto a photosensitive substrate within the exposure device to manufacture an electronic device, the extreme ultraviolet light generating apparatus including a chamber in which a target substance supplied to an internal space is irradiated with a laser beam to generate extreme ultraviolet light, and a target supply device configured to supply the target substance into the chamber, the target supply device including a tank body portion holding the target substance, a communication portion connected to the tank body portion and including a filter configured to filter the target substance in a melted state and a nozzle configured to discharge the target substance having passed through the filter, a main heater configured to heat the tank body portion, a sub-heater configured to heat the communication portion, and a control unit, the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
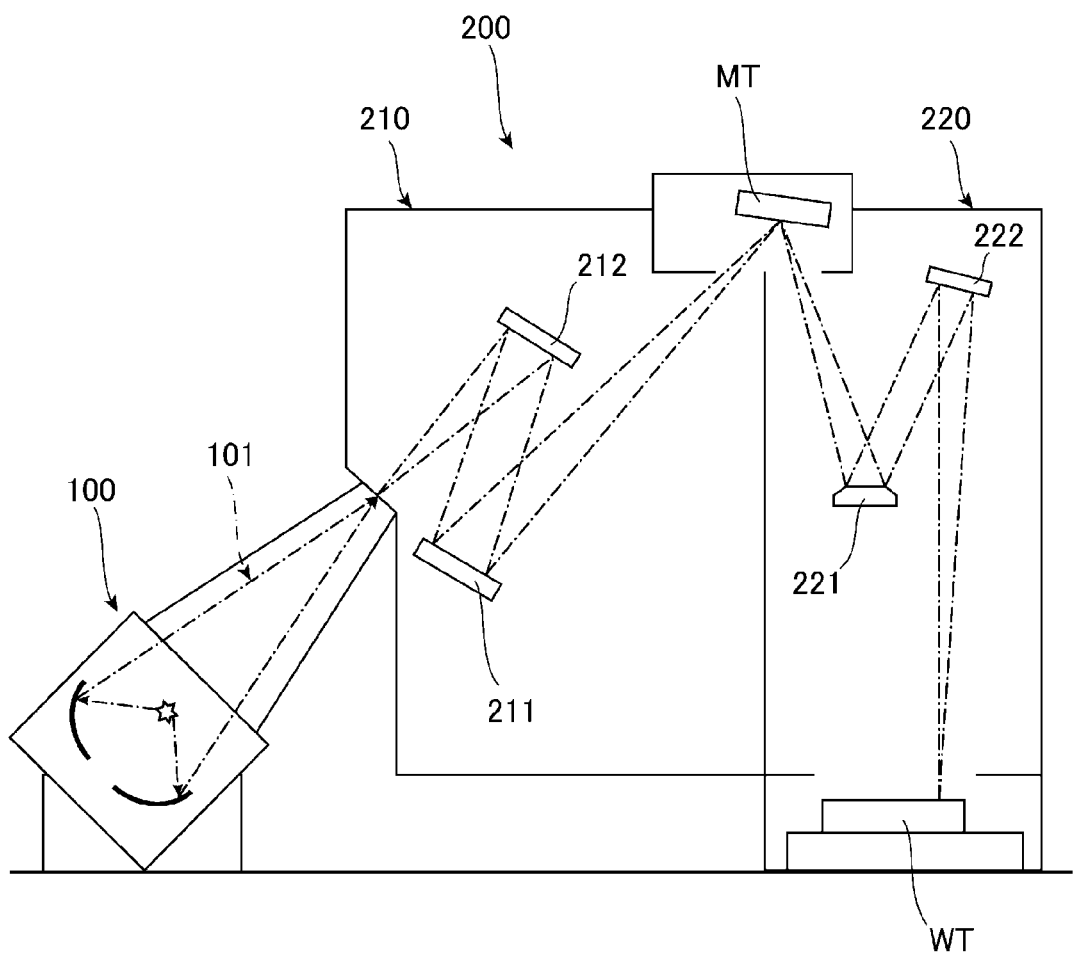
FIG. 1 diagrammatically shows a schematic exemplary configuration of an entire electronic device manufacturing apparatus.

1. Overview
2. Description of electronic device manufacturing apparatus
3. Description of extreme ultraviolet light generating apparatus of comparative example
   3.1 Configuration of extreme ultraviolet light generating apparatus of comparative example
   3.2 Operation of extreme ultraviolet light generating apparatus of comparative example
   3.3 Problem
4. Embodiment 1
   4.1 Operation of extreme ultraviolet light generating apparatus of Embodiment 1
   4.2 Effect
5. Embodiment 2
   5.1 Operation of extreme ultraviolet light generating apparatus of Embodiment 2
   5.2 Effect Now, with reference to the drawings, embodiments of the present disclosure will be described in detail.

The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Overview

Embodiments of the present disclosure relate to an extreme ultraviolet light generating apparatus configured to generate light having a wavelength of extreme ultraviolet (EUV) light and an electronic device manufacturing apparatus. Hereinafter, the extreme ultraviolet light is sometimes referred to as EUV light.

2. Description of Electronic Device Manufacturing Apparatus

As shown in FIG. 1, an electronic device manufacturing apparatus includes an EUV light generating apparatus 100 and an exposure device 200. The exposure device 200 includes a mask irradiating unit 210 including a plurality of mirrors 211, 212, and a workpiece irradiating unit 220 including a plurality of mirrors 221, 222. The mask irradiating unit 210 illuminates, with EUV light 101 incident from the EUV light generating apparatus 100, a mask pattern on a mask table MT through a reflective optical system. The workpiece irradiating unit 220 forms an image of the EUV light 101 reflected by the mask table MT on a workpiece (not shown) arranged on a workpiece table WT through the reflective optical system. The workpiece is a photosensitive substrate such as a semiconductor wafer on which photoresist is applied. The exposure device 200 synchronously translates the mask table MT and the workpiece table WT to expose the EUV light 101 reflecting the mask pattern onto the workpiece. Through an exposure process as described above, a device pattern is transferred onto the semiconductor wafer, thereby manufacturing a semiconductor device.

3. Description of Extreme Ultraviolet Light Generating Apparatus of Comparative Example

Figure 2:
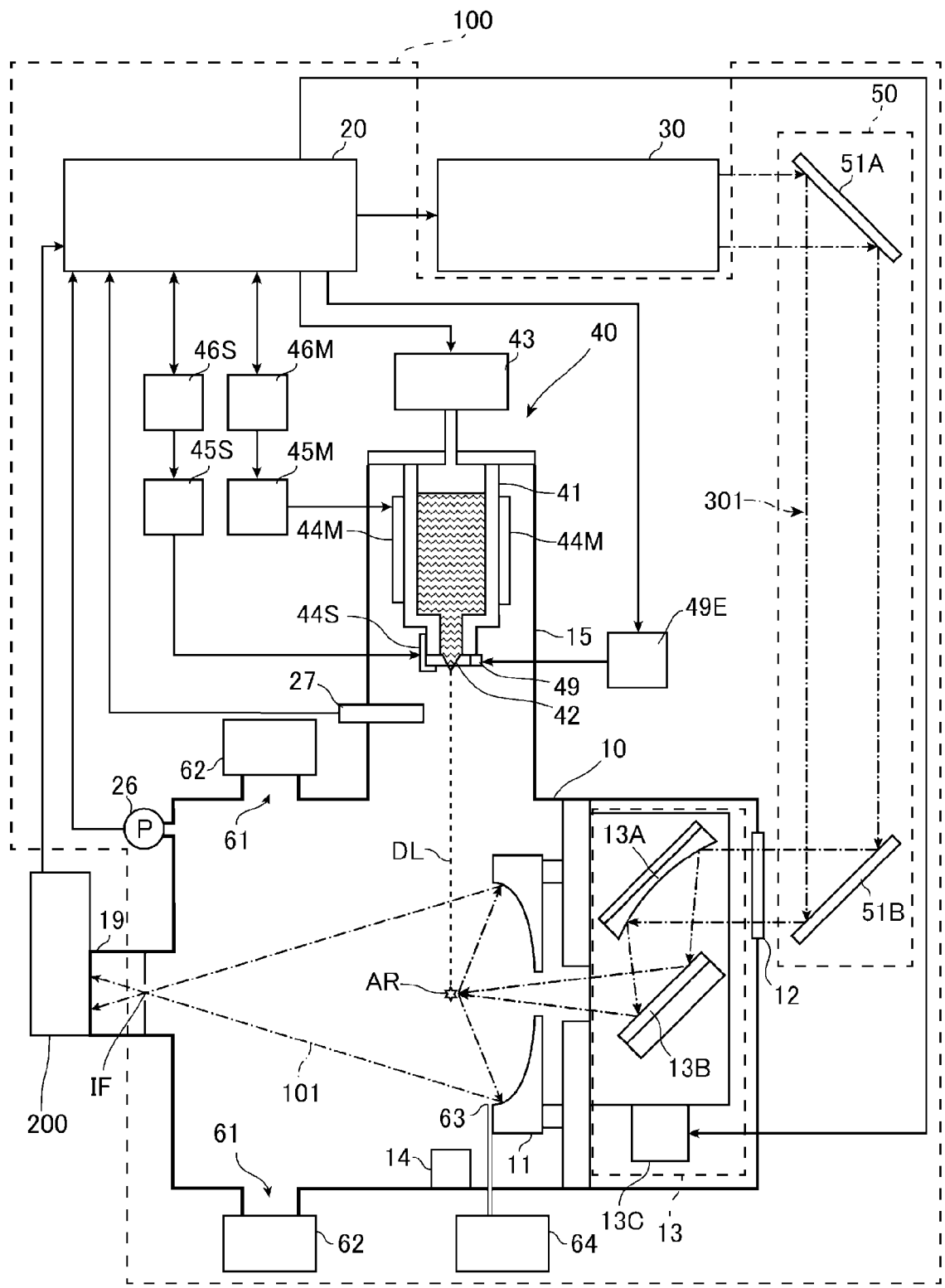
FIG. 2 diagrammatically shows a schematic exemplary configuration of an entire extreme ultraviolet light generating apparatus.

3.1 Configuration of Extreme Ultraviolet Light Generating Apparatus of Comparative Example FIG. 2 diagrammatically shows a schematic exemplary configuration of an entire extreme ultraviolet light generating apparatus of this example. As shown in FIG. 2, a laser apparatus 30 is connected to an EUV light generating apparatus 100 of this example. The EUV light generating apparatus 100 of this example includes a chamber 10, a control unit 20, and a laser beam delivery optical system 50.

The chamber 10 is a sealable container. A sub-chamber 15 provided with a target supply device 40 is connected to the chamber 10. The target supply device 40 includes a tank 41. The target supply device 40 is configured to supply a droplet DL to an internal space of the chamber 10, and is mounted, for example, to extend through a wall of the sub-chamber 15. The droplet DL, which is also called a target, is supplied from the target supply device 40.

The tank 41 stores therein a target substance to form the droplet DL. The target substance may include tin, terbium, gadolinium, lithium, or xenon, or any combinations of two or more of them, but not limited thereto. An inside of the tank 41 communicates with, through a pipe, a pressure adjuster 43 configured to adjust gas pressure. The pressure adjuster 43 is connected to a control unit 20. A main heater 44M and a sub-heater 44S are mounted to the tank 41. The main heater 44M is heated by current supplied from a main heater power source 45M, and the sub-heater 44S is heated by current supplied from a sub-heater power source 45S. The main heater power source 45M is connected to and controlled by a main temperature control unit 46M. The sub-heater power source 45S is connected to and controlled by a sub-temperature control unit 46S. The main temperature control unit 46M and the sub-temperature control unit 46S are connected to and controlled by the control unit 20. Through the heating, the target substance in the tank 41 is melted.

A nozzle 42 is mounted to the tank 41 to form part of the tank 41. The nozzle 42 discharges the target substance. A piezoelectric element 49 is mounted to the nozzle 42. The piezoelectric element 49 is connected to a piezoelectric power source 49E and is driven by voltage applied from the piezoelectric power source 49E. The piezoelectric power source 49E is connected to the control unit 20. The target substance discharged from the nozzle 42 is formed into the droplet DL through an operation of the piezoelectric element 49.

The chamber 10 includes a target collecting unit 14. The target collecting unit 14 collects any unnecessary droplet DL.

A wall of the chamber 10 has at least one through-hole. The through-hole is blocked by a window 12, through which a pulsed laser beam 301 emitted from the laser apparatus 30 passes. In the chamber 10, for example, an EUV light condensing mirror 11 having a spheroidal reflective surface is arranged. The EUV light condensing mirror 11 has first and second focal points. On a surface of the EUV light condensing mirror 11, a multilayer reflective film including, for example, alternately stacked molybdenum and silicon is formed. The EUV light condensing mirror 11 may be arranged so that, for example, the first focal point is located in a plasma generating region AR and the second focal point is located at an intermediate focal point IF. A through-hole is provided at a center of the EUV light condensing mirror 11, and the pulsed laser beam 301 passes through the through-hole.

The EUV light generating apparatus 100 includes a connecting portion 19 that provides communication between the internal space of the chamber 10 and an internal space of an exposure device 200. The connecting portion 19 includes therein a wall having an aperture. The wall is preferably arranged so that the aperture is located at the second focal point of the EUV light condensing mirror 11.

The EUV light generating apparatus 100 also includes a pressure sensor 26. The pressure sensor 26 measures pressure in the internal space of the chamber 10. The EUV light generating apparatus 100 further includes a target sensor 27 mounted to the chamber 10. The target sensor 27 has, for example, an imaging function, and is configured to detect presence, a trajectory, a position, a speed, and the like of a droplet DL. The pressure sensor 26 and the target sensor 27 are connected to the control unit 20.

A laser beam condensing optical system 13 is arranged in the chamber 10. The laser beam condensing optical system 13 includes a laser beam condensing mirror 13A and a high reflective mirror 13B. The laser beam condensing mirror 13A reflects and condenses the laser beam 301 passing through the window 12. The high reflective mirror 13B reflects the beam condensed by the laser beam condensing mirror 13A. Positions of the laser beam condensing mirror 13A and the high reflective mirror 13B are adjusted by a laser beam manipulator 13C so that a laser beam condensing position in the chamber 10 matches a position specified by the control unit 20.

In the chamber 10, a gas supply unit 63 configured to supply etching gas to the internal space of the chamber 10 is arranged. The gas supply unit 63 is connected to an etching gas supply tank 64 through a pipe. When the target substance is tin, the etching gas is, for example, balance gas having a hydrogen gas concentration of about 3%. The balance gas may contain nitrogen ($N_2$) gas or argon (Ar) gas.

The gas supply unit 63 is adjusted so that the etching gas supplied into the chamber 10 flows near a reflective surface of the EUV light condensing mirror 11. Tin fine particles and tin ions are generated when the target substance forming the droplet DL is turned into plasma in the plasma generating region AR. The tin fine particles and the tin ions react with hydrogen to generate stannane ($SnH_4$) that is gas at room temperature. A flow rate adjuster (not shown) is provided in a pipe between the gas supply unit 63 and the etching gas supply tank 64.

Exhaust units 61 are provided in the chamber 10. The exhaust units 61 are configured to exhaust residual gas in the chamber 10. Exhaust ports of the exhaust units 61 are formed, for example, in walls of the chamber 10 facing each other. The residual gas contains fine particles and charged particles generated when the target substance is turned into plasma, a product generated by the reaction between the fine particles and the charged particles and the etching gas, and unreacted etching gas. The charged particles are partially neutralized in the chamber 10, and the neutralized charged particles are also contained in the residual gas. The exhaust units 61 are connected to exhaust devices 62, and the residual gas discharged from the exhaust units 61 is subjected to given exhaust treatment in the exhaust devices 62. At least one of the pair of exhaust units 61 may include a trap mechanism such as a heater that traps the fine particles.

A traveling direction of the laser beam 301 emitted from the laser apparatus 30 is adjusted by the laser beam delivery optical system 50. The laser beam delivery optical system 50 includes a plurality of mirrors 51A, 51B for adjusting the traveling direction of the laser beam 301, and positions of at least part of the mirrors 51A, 51B are adjusted by an actuator (not shown).

The laser apparatus 30 includes a master oscillator as a light source that performs a burst operation. The master oscillator emits the pulsed laser beam 301 in a burst-on duration. The master oscillator is, for example, a laser apparatus configured to emit a laser beam by exciting, through electric discharge, gas as mixture of carbon dioxide gas with helium, nitrogen, or the like. Alternatively, the master oscillator may be a quantum cascade laser apparatus. The master oscillator emits the pulsed laser beam 301 by a Q switch system. The master oscillator may include a light switch, a polarizer, and the like. In the burst operation, the continuous pulsed laser beam is emitted at a given repetition frequency in the burst-on duration and the emission of the laser beam 301 is suppressed in a burst-off duration.

The control unit 20 includes a computer including a central processing unit (CPU) and the like. The control unit 20 is configured to control the entire EUV light generating apparatus 100 and also controls the laser apparatus 30 as described later. The control unit 20 receives a signal related to the pressure in the internal space of the chamber 10, which is measured by the pressure sensor 26, a signal related to image data of the droplet DL captured by the target sensor 27, a burst signal from the exposure device 200, and the like. The control unit 20 is configured to process the image data and the like and to control, for example, output timing of the droplet DL, an output direction of the droplet DL, and the like. Such various kinds of control are merely exemplary and different control may be added as described later.

Next, a configuration of the target supply device 40 will be described in more detail.

Figure 3:
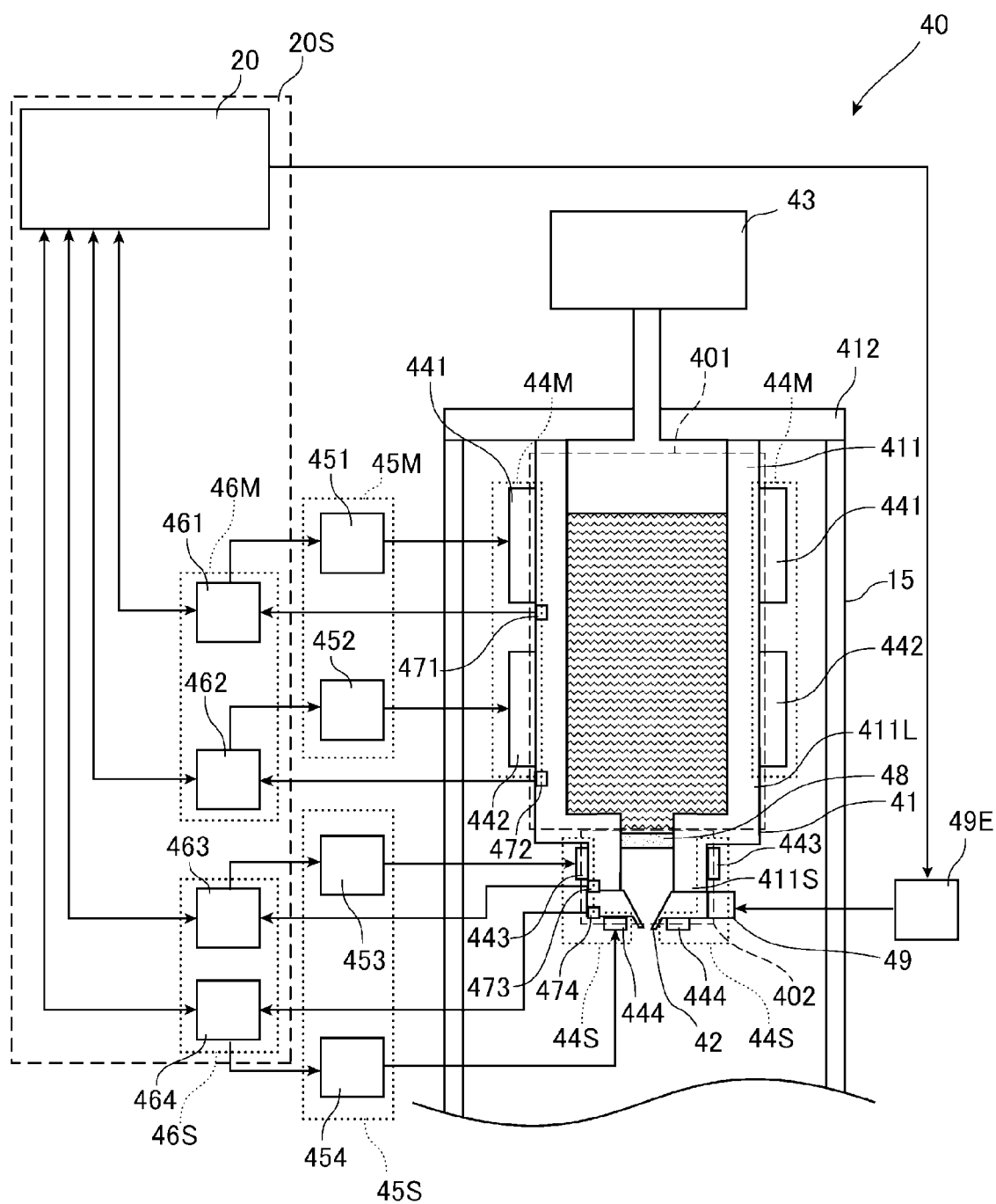
FIG. 3 diagrammatically shows a schematic configuration of a target supply device of a comparative example.

FIG. 3 diagrammatically shows a schematic configuration of the target supply device of the comparative example. As shown in FIG. 3, the tank 41 of the target supply device 40 mainly includes a housing 411, a lid 412, and the nozzle 42. The housing 411 includes a large diameter portion 411L and a small diameter portion 411S having a smaller diameter than the large diameter portion 411L, which are connected to each other. The small diameter portion 411S is connected to a lower end of the large diameter portion 411L. An upper opening of the large diameter portion 411L is blocked by the lid 412. The lid 412 has an opening, through which a pipe connecting to the pressure adjuster 43 is inserted. A lower opening of the small diameter portion 411S is blocked by the nozzle 42. The nozzle 42 has a nozzle hole. In the tank 41 of this embodiment, the lid 412 is exposed outside the chamber 10, and the housing 411 and the nozzle 42 are arranged in the space of the chamber 10. The housing 411 and the lid 412 are made of, for example, molybdenum or tungsten.

The tank 41 is divided into a tank body portion 401 and a communication portion 402 shown by dashed lines in FIG. 3. The tank body portion 401 is located on an upper side of the tank 41, and the communication portion 402 is connected to the tank body portion 401 and is located on a lower side of the tank 41. The tank body portion 401 includes the large diameter portion 411L and the lid 412 of the housing 411. The communication portion 402 includes the small diameter portion 411S, the nozzle 42, and a filter 48 of the housing 411. Thus, a capacity of the communication portion 402 is smaller than a capacity of the tank body portion 401. The filter 48 is arranged at a boundary between the tank body portion 401 and the communication portion 402. The filter 48 filters the melted target substance. The nozzle 42 discharges the target substance having passed through the filter 48 from the nozzle hole as described above.

The filter 48 is made of, for example, a porous material to collect metal oxide. The filter 48 has, for example, numerous through-pores having a size of about 3 to 10 μm. The filter 48 is preferably made of a material with low reactivity with the target substance. A difference between a coefficient of linear thermal expansion of the material for the filter 48 and a coefficient of linear thermal expansion of the material for the housing 411 is preferably smaller than 20% of the coefficient of linear thermal expansion of the material for the housing 411.

The nozzle 42 is preferably made of such a material that a contact angle between its tip and the target substance is 90° or more. When the target substance is tin, the material for the tip of the nozzle 42 may include, for example, silicon carbide, silicon oxide, aluminum oxide, molybdenum, tungsten, or the like.

The main heater 44M includes a first heater 441 and a second heater 442, and is arranged in the tank body portion 401. Specifically, the first heater 441 is arranged closer to the lid 412 on the tank body portion 401, that is, on the upper side of the tank body portion 401, and the second heater 442 is arranged closer to the communication portion 402 on the tank body portion 401, that is, on the lower side of the tank body portion 401.

A first temperature sensor 471 is arranged near the first heater 441 on the tank body portion 401, and a second temperature sensor 472 is arranged near the second heater 442 on the tank body portion 401.

The main heater power source 45M includes a first heater power source 451 and a second heater power source 452. The first heater 441 is connected to the first heater power source 451, and is heated by current applied from the first heater power source 451. The second heater 442 is connected to the second heater power source 452, and is heated by current applied from the second heater power source 452.

The first heater power source 451 is connected to a first temperature control unit 461, and the current applied to the first heater 441 is controlled according to a signal from the first temperature control unit 461. The first temperature control unit 461 is connected to the control unit 20 and the first temperature sensor 471, and controls the current applied to the first heater 441 by the first heater power source 451 based on signals from the control unit 20 and the first temperature sensor 471. The second heater power source 452 is connected to a second temperature control unit 462, and the current applied to the second heater 442 is controlled according to a signal from the second temperature control unit 462. The second temperature control unit 462 is connected to the control unit 20 and the second temperature sensor 472, and controls the current applied to the second heater 442 by the second heater power source 452 based on signals from the control unit 20 and the second temperature sensor 472.

The sub-heater 44S includes a third heater 443 and a fourth heater 444, and is arranged in the communication portion 402. Specifically, the third heater 443 is arranged closer to the tank body portion 401 on the communication portion 402, that is, on the upper side of the communication portion 402, and the fourth heater 444 is arranged closer to the nozzle 42 on the communication portion 402, that is, the lower side of the communication portion 402. In this embodiment, the fourth heater 444 is directly arranged on the nozzle 42 as part of the communication portion 402.

A third temperature sensor 473 is arranged near the third heater 443 on the communication portion 402, and a fourth temperature sensor 474 is arranged near the fourth heater 444 on the communication portion 402. In this embodiment, the fourth temperature sensor 474 is directly arranged on the nozzle 42.

The sub-heater power source 45S includes a third heater power source 453 and a fourth heater power source 454. The third heater 443 is connected to the third heater power source 453, and is heated by current applied from the third heater power source 453. The fourth heater 444 is connected to the fourth heater power source 454, and is heated by current applied from the fourth heater power source 454.

The third heater power source 453 is connected to a third temperature control unit 463, and the current applied to the third heater 443 is controlled according to a signal from the third temperature control unit 463. The third temperature control unit 463 is connected to the control unit 20 and the third temperature sensor 473, and controls the current applied to the third heater 443 by the third heater power source 453 based on signals from the control unit 20 and the third temperature sensor 473. The fourth heater power source 454 is connected to a fourth temperature control unit 464, and the current applied to the fourth heater 444 is controlled according to a signal from the fourth temperature control unit 464. The fourth temperature control unit 464 is connected to the control unit 20 and the fourth temperature sensor 474, and controls the current applied to the fourth heater 444 by the fourth heater power source 454 based on signals from the control unit 20 and the fourth temperature sensor 474.

3.2 Operation of Extreme Ultraviolet Light Generating Apparatus of Comparative Example In the EUV light generating apparatus 100, a new target supply device is mounted to the chamber 10, for example, at new installation or maintenance. Then, an atmosphere in the chamber 10 is exhausted. Pressure in the internal space of the chamber 10 after the atmosphere is exhausted is, for example, in the range of 10 to 80 Pa.

An operation before the target supply device 40 discharges the target substance will be described in detail.

Figure 4:
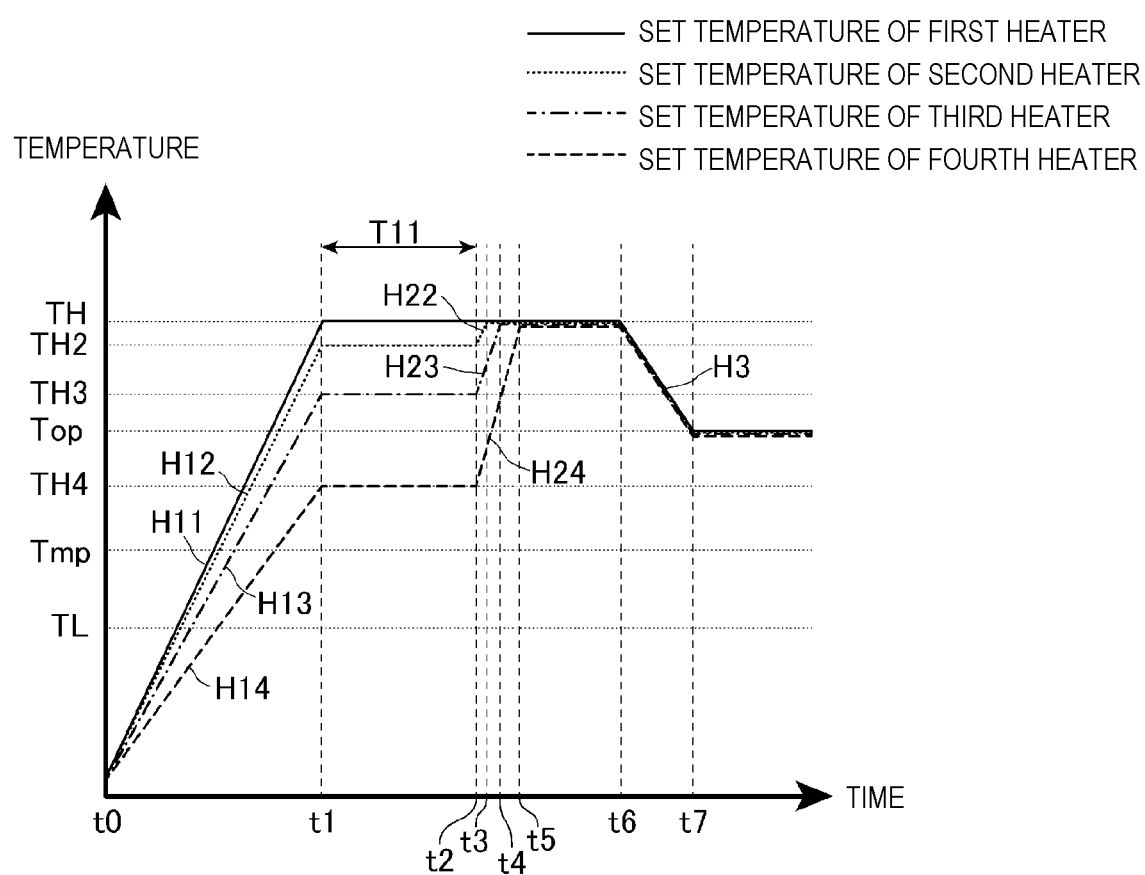
FIG. 4 diagrammatically shows set temperatures of the target supply device of the comparative example.

When the pressure in the internal space of the chamber 10 is brought to the given pressure as described above, the control unit 20 increases set temperatures of the main heater 44M and the sub-heater 44S. FIG. 4 diagrammatically shows set temperatures of the target supply device of the comparative example. As shown in FIG. 4, the control unit 20 controls the temperature control units to increase temperatures of the heaters at an elapsed time t0 when the temperature increase is started. In the description below, the elapsed time refers to a time from the start of the temperature increase.

Specifically, at the elapsed time t0, the control unit 20 outputs a signal containing a temperature TH and a rate H11 of temperature increase to the first temperature control unit 461. At the rate H11, a set temperature of the first heater 441 increases to the temperature TH at an elapsed time t1. Then, the first temperature control unit 461 controls the first heater power source 451 to apply current to the first heater 441 so that a rate of temperature increase of the first heater 441 becomes H11. As described above, the first temperature control unit 461 receives a signal containing information on the temperature of the housing 411 detected by the first temperature sensor 471. Thus, when the first temperature control unit 461 controls the first heater power source 451, the first temperature control unit 461 performs feedback control based on a signal from the first temperature sensor 471 so that a target temperature is reached. Thus, when the first temperature control unit 461 controls the first heater power source 451 to apply current to the first heater 441, there may be a period when a current value is zero.

At the elapsed time t0, the control unit 20 outputs a signal containing a temperature TH2 and a rate H12 of temperature increase to the second temperature control unit 462. At the rate H12, a set temperature of the second heater 442 increases to the temperature TH2 at the elapsed time t1. Then, the second temperature control unit 462 controls the second heater power source 452 to apply current to the second heater 442 so that a rate of temperature increase of the second heater 442 becomes H12. As described above, the second temperature control unit 462 receives a signal containing information on the temperature of the housing 411 detected by the second temperature sensor 472. Thus, when the second temperature control unit 462 controls the second heater power source 452, the second temperature control unit 462 performs feedback control based on a signal from the second temperature sensor 472 so that a target temperature is reached. Thus, when the second temperature control unit 462 controls the second heater power source 452 to apply current to the second heater 442, there may be a period when a current value is zero.

At the elapsed time t0, the control unit 20 outputs a signal containing a temperature TH3 and a rate H13 of temperature increase to the third temperature control unit 463. At the rate H13, a set temperature of the third heater 443 increases to the temperature TH3 at the elapsed time t1. Then, the third temperature control unit 463 controls the third heater power source 453 to apply current to the third heater 443 so that a rate of temperature increase of the third heater 443 becomes H13. As described above, the third temperature control unit 463 receives a signal containing information on the temperature of the housing 411 detected by the third temperature sensor 473. Thus, when the third temperature control unit 463 controls the third heater power source 453, the third temperature control unit 463 performs feedback control based on a signal from the third temperature sensor 473 so that a target temperature is reached. Thus, when the third temperature control unit 463 controls the third heater power source 453 to apply current to the third heater 443, there may be a period when a current value is zero.

At the elapsed time t0, the control unit 20 outputs a signal containing a temperature TH4 and a rate H14 of temperature increase to the fourth temperature control unit 464. At the rate H14, a set temperature of the fourth heater 444 increases to the temperature TH4 at the elapsed time t1. Then, the fourth temperature control unit 464 controls the fourth heater power source 454 to apply current to the fourth heater 444 so that a rate of temperature increase of the fourth heater 444 becomes H14. As described above, the fourth temperature control unit 464 receives a signal containing information on the temperature of the housing 411 detected by the fourth temperature sensor 474. Thus, when the fourth temperature control unit 464 controls the fourth heater power source 454, the fourth temperature control unit 464 performs feedback control based on a signal from the fourth temperature sensor 474 so that a target temperature is reached. Thus, when the fourth temperature control unit 464 controls the fourth heater power source 454 to apply current to the fourth heater 444, there may be a period when a current value is zero.

As such, at the elapsed time t1, the set temperature of the first heater 441 reaches the temperature TH. At the elapsed time t1, the set temperature of the second heater 442 reaches the temperature TH2 lower than the temperature TH. At the elapsed time t1, the set temperature of the third heater 443 reaches the temperature TH3 lower than the temperature TH2. At the elapsed time t1, the set temperature of the fourth heater 444 reaches the temperature TH4 lower than the temperature TH3. The temperature TH4 is higher than a melting point Tmp of the target substance.

Next, at the elapsed time t1, the control unit 20 keeps the set temperatures of the first heater 441 to the fourth heater 444 at the temperatures TH to TH4 as the set temperatures at the elapsed time t1. Thus, the first temperature control unit 461 keeps the set temperature of the first heater 441 at the temperature TH. The second temperature control unit 462 keeps the set temperature of the second heater 442 at the temperature TH2, the third temperature control unit 463 keeps the set temperature of the third heater 443 at the temperature TH3, and the fourth temperature control unit 464 keeps the set temperature of the fourth heater 444 at the temperature TH4.

Next, at an elapsed time t2, the control unit 20 controls the set temperatures of the heaters as described below. In a period T11 from the elapsed time t1 to the elapsed time t2, the target substance in the tank 41 reaches the set temperatures. As described above, the set temperature of the fourth heater 444, which is the lowest among the set temperatures of the four heaters, is higher than the melting point Tmp of the target substance, and thus the target substance has been melted at the elapsed time t2.

Also at the elapsed time t2, the control unit 20 keeps the set temperature of the first heater 441 at the temperature TH as the set temperature at the elapsed time t2. Thus, the first temperature control unit 461 keeps the set temperature of the first heater 441 at the temperature TH. Specifically, the first temperature control unit 461 keeps the set temperature of the first heater 441 at the temperature TH even after the elapsed time t1 and the elapsed time t2.

At the elapsed time t2, the control unit 20 outputs a signal containing the temperature TH and a rate H22 of temperature increase to the second temperature control unit 462. At the rate H22, the set temperature of the second heater 442 increases to the temperature TH at an elapsed time t3. Then, the second temperature control unit 462 controls the second heater power source 452 to apply current to the second heater 442 so that the rate of temperature increase of the second heater 442 becomes H22.

At the elapsed time t2, the control unit 20 outputs a signal containing the temperature TH and a rate H23 of temperature increase to the third temperature control unit 463. At the rate H23, the set temperature of the third heater 443 increases to the temperature TH at an elapsed time t4. Then, the third temperature control unit 463 controls the third heater power source 453 to apply current to the third heater 443 so that the rate of temperature increase of the third heater 443 becomes H23.

At the elapsed time t2, the control unit 20 outputs a signal containing the temperature TH and a rate H24 of temperature increase to the fourth temperature control unit 464. At the rate H24, the set temperature of the fourth heater 444 increases to the temperature TH at an elapsed time t5. Then, the fourth temperature control unit 464 controls the fourth heater power source 454 to apply current to the fourth heater 444 so that the rate of temperature increase of the fourth heater 444 becomes H24.

Next, at the elapsed time t3, the control unit 20 keeps the set temperature of the second heater 442 at the temperature TH as the set temperature at the elapsed time t3. Thus, the second temperature control unit 462 keeps the set temperature of the second heater 442 at the temperature TH even after the elapsed time t3.

Next, at the elapsed time t4, the control unit 20 keeps the set temperature of the third heater 443 at the temperature TH as the set temperature at the elapsed time t4. Thus, the third temperature control unit 463 keeps the set temperature of the third heater 443 at the temperature TH even after the elapsed time t4.

Next, at the elapsed time t5, the control unit 20 keeps the set temperature of the fourth heater 444 at the temperature TH as the set temperature at the elapsed time t5. Thus, the fourth temperature control unit 464 keeps the set temperature of the fourth heater 444 at the temperature TH even after the elapsed time t5.

As such, the first heater 441 to the fourth heater 444 are set to the temperature TH before and at the elapsed time t5. Then, from the elapsed time t5 to an elapsed time t6, the set temperatures of the first heater 441 to the fourth heater 444 are kept at the temperature TH.

Next, at the elapsed time t6, the control unit 20 outputs a signal containing a temperature Top and a rate H3 of temperature decrease to the first temperature control unit 461 to the fourth temperature control unit 464. At the rate H3, the set temperatures of the first heater 441 to the fourth heater 444 decrease to the temperature Top at an elapsed time t7. Then, the first temperature control unit 461 controls the first heater power source 451 to apply current to the first heater 441 so that the rate of temperature decrease of the first heater 441 becomes H3. The second temperature control unit 462 controls the second heater power source 452 to apply current to the second heater 442 so that the rate of temperature decrease of the second heater 442 becomes H3. The third temperature control unit 463 controls the third heater power source 453 to apply current to the third heater 443 so that the rate of temperature decrease of the third heater 443 becomes H3. The fourth temperature control unit 464 controls the fourth heater power source 454 to apply current to the fourth heater 444 so that the rate of temperature decrease of the fourth heater 444 becomes H3. When the temperature control units control the heater power sources to apply current to the heaters, there may be a period when a current value is zero.

Next, the control unit 20 keeps the set temperatures of the first heater 441 to the fourth heater 444 at the temperature Top at and after the elapsed time t7. Thus, the first temperature control unit 461 to the fourth temperature control unit 464 keep thereafter the set temperatures of the first heater 441 to the fourth heater 444 at the temperature Top.

In the temperature control, the first temperature control unit 461 receives the signal containing the information on the temperature of the housing 411 detected by the first temperature sensor 471, and performs the feedback control based on the signal from the first temperature sensor 471 so that the target temperature is reached. In the temperature control, the second temperature control unit 462 receives the signal containing the information on the temperature of the housing 411 detected by the second temperature sensor 472, and performs the feedback control based on the signal from the second temperature sensor 472 so that the target temperature is reached. In the temperature control, the third temperature control unit 463 receives the signal containing the information on the temperature of the housing 411 detected by the third temperature sensor 473, and performs the feedback control based on the signal from the third temperature sensor 473 so that the target temperature is reached. In the temperature control, the fourth temperature control unit 464 receives the signal containing the information on the temperature of the housing 411 detected by the fourth temperature sensor 474, and performs the feedback control based on the signal from the fourth temperature sensor 474 so that the target temperature is reached.

Then, at and after the elapsed time t7, the control unit 20 controls the pressure adjuster 43 to adjust pressure in the tank 41, and the pressure adjuster 43 increases the pressure in the tank 41 to, for example, about 10 MPa. Then, the melted target substance passes through the filter 48. At this time, impurities such as oxide or the like in the target substance is removed by the filter 48. As such, the target substance is filtered. The target substance having passed through the filter 48 is discharged from the nozzle hole of the nozzle 42 at a given speed. The target substance discharged from the hole of the nozzle 42 may be in the form of jet.

The control unit 20 generates the droplet DL by applying voltage having a given waveform from the piezoelectric power source 49E to the piezoelectric element 49. Vibration of the piezoelectric element 49 can propagate through the nozzle 42 to the jet of the target substance discharged through the hole of the nozzle. The jet of the target substance is divided at a given cycle by the vibration, and the droplet DL is generated from the target substance.

As such, the target substance is supplied from the target supply device 40.

When the target substance is supplied and the droplet DL is generated, the control unit 20 outputs a light emission trigger to the laser apparatus 30. Having received the light emission trigger, the laser apparatus 30 emits the pulsed laser beam 301. The emitted laser beam 301 is incident on the laser beam condensing optical system 13 through the laser beam delivery optical system 50 and the window 12.

The control unit 20 controls the laser beam manipulator 13C of the laser beam condensing optical system 13 so that the laser beam 301 condenses in the plasma generating region AR. The control unit 20 controls the laser apparatus 30 to emit the laser beam 301 based on the signal from the target sensor 27 so that the droplet DL is irradiated with the laser beam 301. Thus, the droplet DL is irradiated in the plasma generating region AR with the laser beam 301 converged by the laser beam condensing mirror 13A. Plasma generated through the irradiation radiates light including EUV light.

Among the light generated in the plasma generating region AR and including EUV light, the EUV light 101 is condensed on the intermediate focal point IF by the EUV light condensing mirror 11 and is then incident on the exposure device 200.

The residual gas containing unnecessary fine particles in the chamber is discharged from the exhaust unit 61 and treated in the exhaust device 62.

3.3 Problem

Since the capacity of the communication portion 402 is smaller than the capacity of the tank body portion 401 as described above, the communication portion 402 is more easily heated than the tank body portion 401. Also, the lid 412 of the tank body portion 401 is exposed to the atmosphere, and heat is easily released therefrom. Thus, even if the set temperatures of the heaters arranged in the upper part of the tank 41 are increased from the elapsed time t0 to the elapsed time t1 as in the comparative example, the temperature inside the tank 41 may be increased from the lower side of the tank 41 near the communication portion 402. In this case, the target substance closer to the lid 412 in the tank 41 is not melted, but the target substance closer to the communication portion 402 in the tank 41 may be melted. Then, the melted target substance may be thermally expanded with the unmelted target substance blocking the melted target substance and may unnecessarily pass through the filter 48. If the target substance passes through the filter 48 in this manner, the target substance may react with oxygen in the communication portion 402 and be oxidized. If the target substance has been already placed in the communication portion 402, the target substance having passed through the filter 48 presses the target substance placed in the communication portion 402, and the target substance may be unnecessarily discharged from the nozzle 42. Also, if the set temperatures of the heaters are equally set to the temperature Top at and after the elapsed time t7, the temperature of the target substance easily decreases in the upper part of the tank 41 where the heat is easily released as described above, and the target substance may be insufficiently melted in the upper part of the tank 41.

Then, embodiments described below exemplify a target supply device that can suppress unnecessary oxidation of a target substance and unnecessary discharge of the target substance.

4. Embodiment 1

4.1 Operation of Extreme Ultraviolet Light Generating Apparatus of Embodiment 1

Next, an operation of a target supply device of Embodiment 1 will be described. Components similar to those described above are denoted by the same reference numerals, and overlapping descriptions are omitted unless otherwise stated. A configuration of an extreme ultraviolet light generating apparatus including the target supply device of this embodiment is similar to the configuration of the extreme ultraviolet light generating apparatus including the target supply device of the comparative example, and descriptions on the configuration of the extreme ultraviolet light generating apparatus including the target supply device of this embodiment are omitted.

Figure 5:
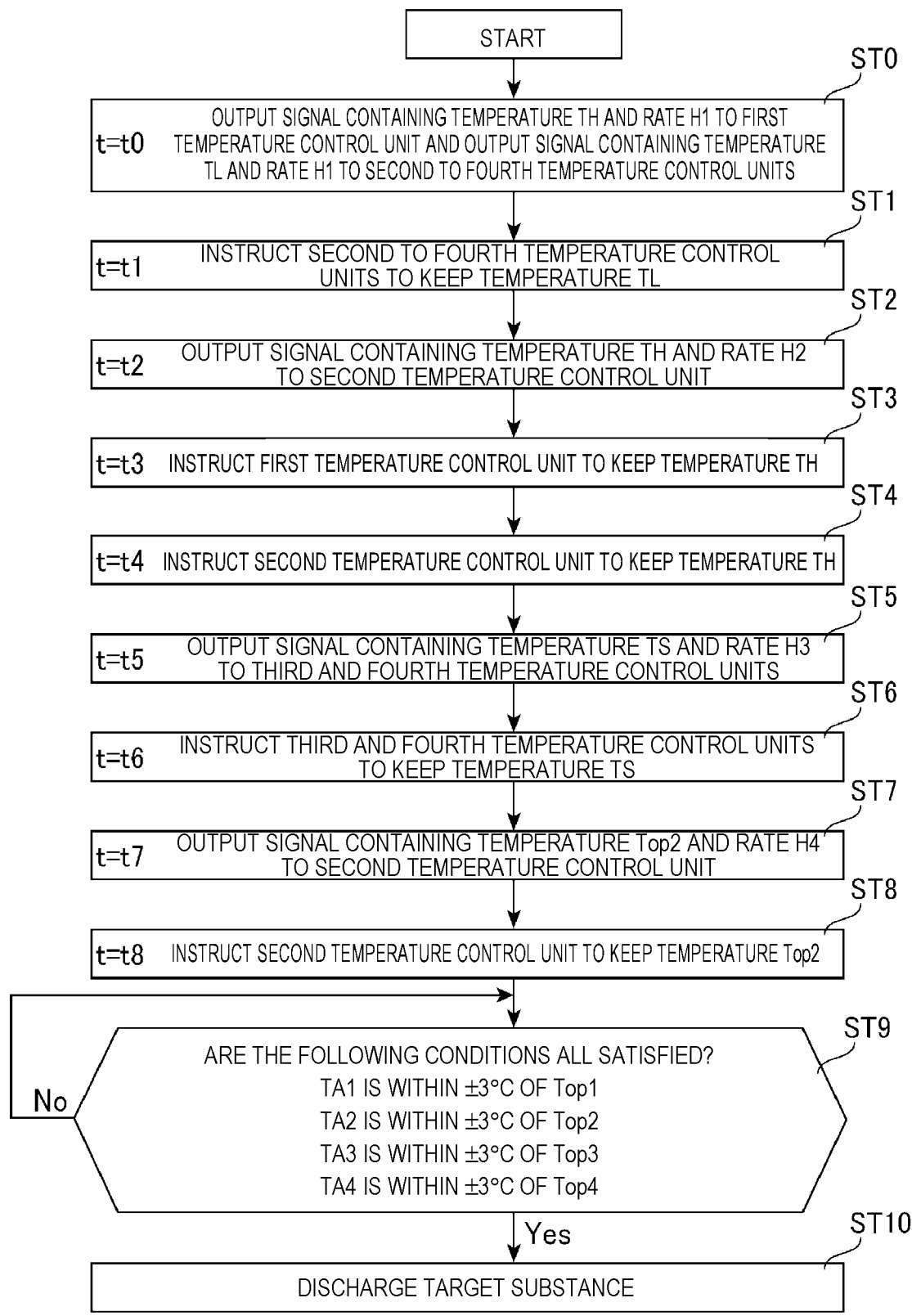
FIG. 5 is a flowchart of an operation of a control unit in Embodiment 1.
Figure 6:
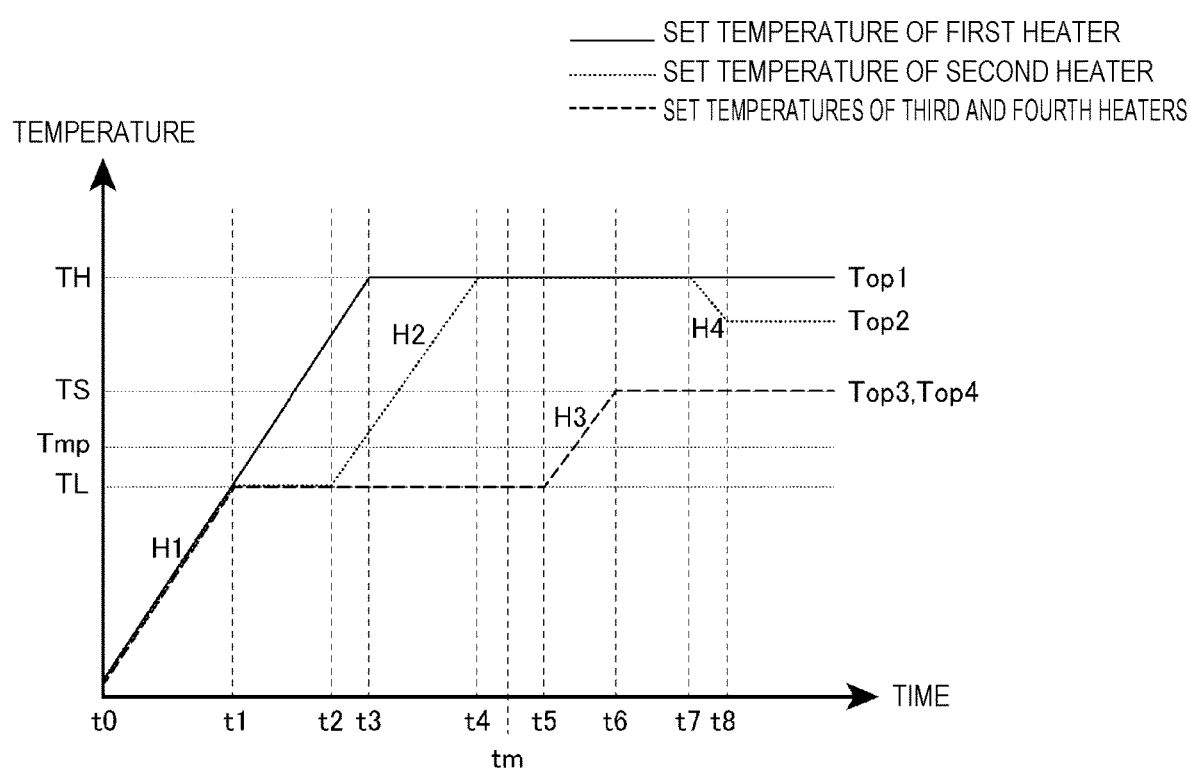
FIG. 6 diagrammatically shows set temperatures of a target supply device of Embodiment 1.

Like the operation of the EUV light generating apparatus 100 of the comparative example, when pressure in an internal space of a chamber 10 is brought to given pressure, a control unit 20 increases set temperatures of a main heater 44M and a sub-heater 44S. FIG. 5 is a flowchart of an operation of the control unit in this embodiment, and FIG. 6 diagrammatically shows set temperatures of the target supply device of this embodiment. In this embodiment, as described later, an example in which set temperatures of a third heater 443 and a fourth heater 444 are equal is described. Thus, in FIG. 6, the same line shows the set temperatures of the third heater 443 and the fourth heater 444. Even if elapsed times and rates of temperature increase and decrease in FIG. 6 are denoted by the same reference numerals as in FIG. 4, the elapsed times and the rates of temperature increase and decrease are not always equal to those in FIG. 4.

<Step ST0>

As shown in FIGS. 5 and 6, at an elapsed time to, the control unit 20 controls temperature control units to increase temperatures of the heaters at given rates.

Specifically, at the elapsed time t0, the control unit 20 outputs a signal containing a temperature TH and a rate H1 of temperature increase to a first temperature control unit 461. At the rate H1, a set temperature of a first heater 441 increases to the temperature TH at an elapsed time t3. Then, the first temperature control unit 461 controls a first heater power source 451 to apply current to the first heater 441 so that a rate of temperature increase of the first heater 441 becomes H1. The temperature TH is higher than a melting point Tmp of a target substance. When the target substance is tin, the temperature TH is, for example, 280° C. to 320° C.

The control unit 20 outputs a signal containing a temperature TL and the rate H1 of temperature increase to a second temperature control unit 462 to a fourth temperature control unit 464. At the rate H1, set temperatures of a second heater 442 to the fourth heater 444 increase to the temperature TL at the elapsed time t1. Then, the second temperature control unit 462 controls a second heater power source 452 to apply current to the second heater 442 so that a rate of temperature increase of the second heater 442 becomes H1. The third temperature control unit 463 controls a third heater power source 453 to apply current to the third heater 443 so that a rate of temperature increase of the third heater 443 becomes H1. The fourth temperature control unit 464 controls a fourth heater power source 454 to apply current to the fourth heater 444 so that a rate of temperature increase of the fourth heater 444 becomes H1. Specifically, from the elapsed time t0 to the elapsed time t1, the temperatures of all the heaters are increased at the same rate.

As such, at the elapsed time t1, the temperatures of the heaters generally reach the temperature TL. The temperature TL is lower than a melting point Tmp of the target substance. When the target substance is tin, the temperature TL is, for example 200° C. to 220° C.

<Step ST1>

At the elapsed time t1, the first temperature control unit 461 controls the first heater power source 451 so that the temperature of the first heater 441 increases at the rate H1. At the elapsed time t1, the control unit 20 keeps the set temperatures of the second heater 442 to the fourth heater 444 at the temperature TL as the set temperature at the elapsed time t1. Thus, the second temperature control unit 462 keeps the set temperature of the second heater 442 at the temperature TL, the third temperature control unit 463 keeps the set temperature of the third heater 443 at the temperature TL, and the fourth temperature control unit 464 keeps the set temperature of the fourth heater 444 at the temperature TL. At this time, the temperatures of the second heater 442 to the fourth heater 444 may slightly change. For example, the temperature TL is 210° C., and the temperatures of the second heater 442 to the fourth heater 444 may change approximately ±5° C. from the temperature TL.

<Step ST2>

At an elapsed time t2, the first temperature control unit 461 controls the first heater power source 451 so that the temperature of the first heater 441 increases at the rate H1. At the elapsed time t2, the control unit 20 outputs a signal containing the temperature TH and a rate H2 of temperature increase to the second temperature control unit 462. At the rate H2, the set temperature of the second heater 442 increases to the temperature TH at an elapsed time t4. Then, the second temperature control unit 462 controls the second heater power source 452 to apply current to the second heater 442 so that a rate of temperature increase of the second heater 442 becomes H2. A period from the elapsed time t1 to the elapsed time t2 is preferably, for example, 10 to 30 minutes. At the elapsed time t2, the third temperature control unit 463 and the fourth temperature control unit 464 keep the set temperatures of the third heater 443 and the fourth heater 444 at the temperature TL.

<Step ST3>

At an elapsed time t3, the control unit 20 keeps the set temperature of the first heater 441 at the temperature TH as the set temperature at the elapsed time t3. Thus, the first temperature control unit 461 keeps the set temperature of the first heater 441 at the temperature TH. At and after the elapsed time t3, the set temperature of the first heater 441 is kept at the temperature TH. Thus, when the target substance is tin, the first heater 441 is kept at, for example, 280° C. to 320° C. at and after the elapsed time t3. The temperature of the first heater 441 is defined as Top1. Thus, the temperature Top1 is the temperature TH. The temperature Top1 of the first heater 441 at and after the elapsed time t3 may slightly change. For example, the temperature Top1 may change approximately ±5° C. from the temperature TH. In the example in FIG. 5, the elapsed time t3 is after the elapsed time t2, but the order of the elapsed time t2 and the elapsed time t3 may be changed. Specifically, the order of Step ST2 and Step ST3 may be changed.

<Step ST4>

At an elapsed time t4, the control unit 20 keeps the set temperature of the second heater 442 at the temperature TH as the set temperature at the elapsed time t4. Thus, the second temperature control unit 462 keeps the set temperature of the second heater 442 at the temperature TH. The elapsed time t4 is prior to an elapsed time tm when the target substance in a tank body portion 401 is completely melted. The elapsed time tm is predetermined by an experiment or the like from the set temperatures of the first heater 441 and the second heater 442, a capacity of the tank body portion 401, the melting point of the target substance, and the like. Specifically, the control unit 20 sets the first heater 441 and the second heater 442 as the main heater 44M to the temperature higher than the melting point Tmp of the target substance before the target substance is melted. After the elapsed time t4, the temperature of the second heater 442 may slightly change. For example, the temperature of the second heater 442 may change approximately ±5° C. from the temperature TH. As shown in FIG. 6, at the elapsed time t4, the set temperatures of the third heater 443 and the fourth heater 444 are kept at the temperature TL.

<Step ST5>

At an elapsed time t5, the control unit 20 outputs a signal containing a temperature TS and a rate H3 of temperature increase to the third temperature control unit 463 and the fourth temperature control unit 464. At the rate H3, the set temperatures of the third heater 443 and the fourth heater 444 increase to the temperature TS at an elapsed time t6. Then, the third temperature control unit 463 controls the third heater power source 453 to apply current to the third heater 443 so that a rate of temperature increase of the third heater 443 becomes H3. The fourth temperature control unit 464 controls the fourth heater power source 454 to apply current to the fourth heater 444 so that a rate of temperature increase of the fourth heater 444 becomes H3.

The elapsed time t5 is after the elapsed time tm when the target substance in the tank body portion 401 is melted. Specifically, the control unit 20 sets the third heater 443 and the fourth heater 444 as the sub-heater 44S to the temperature TL lower than the melting point of the target substance until the target substance in the tank body portion 401 is melted. As described above, the temperatures of the third heater 443 and the fourth heater 444 may change approximately ±5° C. from the temperature TL. Thus, the set temperatures of the third heater 443 and the fourth heater 444 at the elapsed time t1 to the elapsed time t5 are within a second temperature range. A period from the elapsed time t1 to the elapsed time t5 is defined as a second given period. In this case, the control unit 20 keeps the set temperatures of the third heater 443 and the fourth heater 444 as the sub-heater 44S within the second temperature range lower than the melting point Tmp of the target substance for the second given period from before to after the target substance is melted. When the target substance is tin, the second temperature range is 200° C. to 220° C. A period from the elapsed time tm to the elapsed time t5 is preferably, for example, 10 to 120 minutes.

The elapsed time t5 is a predetermined given time from the elapsed time t0 when the sub-heater 44S starts heating, after the elapsed time tm when the target substance in the tank body portion 401 is melted. Thus, a time when the set temperatures of the third heater 443 and the fourth heater 444 as the sub-heater 44S become higher than the melting point Tmp of the target substance is also the predetermined given time after the elapsed time tm when the target substance in the tank body portion 401 is melted. Specifically, in this embodiment, the control unit 20 increases the set temperatures of the sub-heater 44S to be higher than the melting point Tmp of the target substance at the predetermined given time after the target substance is melted.

<Step ST6>

At the elapsed time t6, the control unit 20 keeps the set temperatures of the third heater 443 and the fourth heater 444 at the temperature TS as a set temperature at the elapsed time t6. Thus, the third temperature control unit 463 keeps the set temperature of the third heater 443 at the temperature TS, and the fourth temperature control unit 464 keeps the set temperature of the fourth heater 444 at the temperature TS. The temperature TS is higher than the melting point Tmp of the target substance and lower than the temperature TH. When the target substance is tin, the temperature TS is, for example, 240° C. to 270° C. At and after the elapsed time t6, the set temperatures of the third heater 443 and the fourth heater 444 are kept at the temperature TS. The temperature of the third heater 443 is defined as Top3, and the temperature of the fourth heater 444 is defined as Top4. Thus, the temperatures Top3, Top4 are the temperature TS. The temperature Top3 of the third heater 443 and the temperature Top4 of the fourth heater 444 at and after the elapsed time t6 may slightly change. For example, the temperature Top3 of the third heater 443 and the temperature Top4 of the fourth heater 444 may change approximately ±5° C. from the temperature TS. In the example in FIG. 6, the temperature Top3 and the temperature Top4 are equal, but the control unit 20 may set the temperature Top4 to a temperature higher than the melting point Tmp of the target substance and lower than the temperature Top3. As shown in FIG. 6, at the elapsed time t6, the set temperatures of the first heater 441 and the second heater 442 are kept at the temperature TH.

<Step ST7>

At an elapsed time t7, the control unit 20 outputs a signal containing a temperature Top2 and a rate H4 of temperature decrease to the second temperature control unit 462. At the rate H4, the set temperature of the second heater 442 decreases to the temperature Top2 at an elapsed time t8. Then, the second temperature control unit 462 controls the second heater power source 452 to apply current to the second heater 442 so that a rate of temperature decrease of the second heater 442 becomes H4. As described above, when the second temperature control unit 462 controls the second heater power source 452 to apply current to the second heater 442, there may be a period when a current value is zero. A period from the elapsed time t6 to the elapsed time t7 is preferably, for example, 5 to 60 minutes. As described above, the temperatures of the first heater 441 and the second heater 442 may change approximately ±5° C. from the temperature TH. Thus, the set temperatures of the first heater 441 and the second heater 442 from the elapsed time t4 to the elapsed time t7 are within a first temperature range. A period from the elapsed time t4 to the elapsed time t7 is defined as a first given period. In this case, the control unit 20 keeps the set temperatures of the first heater 441 and the second heater 442 as the main heater 44M within the first temperature range higher than the melting point Tmp of the target substance for the first given period from before to after the target substance is melted. When the target substance is tin, the first temperature range is 280° C. to 320° C. The second given period is also from before to after the target substance is melted, and thus the first given period and the second given period partially overlap.

<Step ST8>

Next, at the elapsed time t8, the control unit 20 keeps the set temperature of the second heater 442 at the temperature Top2 as a set temperature at the elapsed time t8. Thus, the second temperature control unit 462 keeps the set temperature of the second heater 442 at the temperature Top2. The temperature Top2 is lower than the temperature Top1 of the first heater 441 and higher than the temperature Top3 of the third heater 443. When the target substance is tin, the temperature Top2 is, for example, 270° C. to 310° C. The control unit 20 keeps the set temperature of the second heater 442 at the temperature Top2 at and after the elapsed time t8. The temperature Top2 of the second heater 442 at and after the elapsed time t8 may slightly change. For example, the temperature Top2 of the second heater 442 may change approximately ±5° C.

<Step ST9>

At and after the elapsed time t8, the control unit 20 keeps the set temperatures of the first heater 441 to the fourth heater 444 at the temperatures at the elapsed time t8. Thus, in this embodiment, at and after the elapsed time t8, the set temperature of the first heater 441 is the temperature Top1, the set temperature of the second heater 442 is the temperature Top2, the set temperature of the third heater 443 is the temperature Top3, and the set temperature of the fourth heater 444 is the temperature Top4. In this embodiment, Top1 is higher than Top2, Top2 is higher than Top3, and Top3 is equal to Top4. However, Top3 may be higher than Top4. In this case, the heaters closer to a lid 412 exposed from the chamber 10 are set to higher temperatures.

At and after the elapsed time t8, the control unit 20 determines whether or not a temperature TA1 detected by the first temperature sensor 471 is within a temperature range of ±3° C. from the temperature Top1. At and after the elapsed time t8, the control unit 20 determines whether or not a temperature TA2 detected by the second temperature sensor 472 is within a temperature range of ±3° C. from the temperature Top2. At and after the elapsed time t8, the control unit 20 determines whether or not a temperature TA3 detected by the third temperature sensor 473 is within a temperature range of ±3° C. from the temperature Top3. At and after the elapsed time t8, the control unit 20 determines whether or not a temperature TA4 detected by the fourth temperature sensor 474 is within a temperature range of ±3° C. from the temperature Top4. Then, if even one of the temperatures detected by the first temperature sensor 471 to the fourth temperature sensor 474 does not fall within the temperature range, the control unit 20 again determines whether or not the temperatures detected by the temperature sensors are within the temperature range of ±3° C. from the respective set temperatures. As such, the control unit 20 waits until the temperatures detected by all the temperature sensors fall within the range of ±3° C. from the respective set temperatures. Then, when the temperatures detected by all the temperature sensors fall within the range of ±3° C. from the respective set temperatures, the control unit 20 goes to Step ST10.

<Step ST10>

In step ST10, the control unit 20 controls a pressure adjuster 43 as the control unit 20 does at and after the elapsed time t7 in the comparative example. Thus, the melted target substance passes through a filter 48, and is discharged from a nozzle hole of a nozzle 42 to form a droplet DL.

When the droplet DL is formed, the droplet DL is irradiated with a pulsed laser beam 301, and light including EUV light is radiated as in the comparative example. Then, EUV light 101 is incident on an exposure device 200.

4.2 Effect

In this embodiment, the control unit 20 sets the main heater 44M to the temperatures higher than the melting point Tmp of the target substance, and sets the sub-heater 44S to the temperatures lower than the melting point Tmp of the target substance until the target substance in the tank body portion 401 is melted. Thus, even if the target substance in the tank body portion 401 is melted and expanded, and is insufficiently melted in the tank body portion 401 on a side opposite to a communication portion 402, the target substance cannot easily pass through the filter 48 in the communication portion 402. Thus, even if oxygen exists in the communication portion 402, entry of the melted target substance into the communication portion 402 can be suppressed, thereby suppressing oxidation of the target substance. Also, even if the target substance exists in the communication portion 402, the sub-heater 44S are set to the temperatures lower than the melting point Tmp of the target substance, thereby suppressing unnecessary discharge of the target substance from the nozzle 42. The control unit 20 sets the sub-heater 44S to the temperature higher than the melting point of the target substance after the target substance in the tank body portion 401 is melted, and thus the target substance can be appropriately discharged from the nozzle after the target substance in the tank body portion 401 is melted.

In this embodiment, the control unit 20 keeps the set temperatures of the main heater 44M within the first temperature range higher than the melting point Tmp of the target substance for the first given period from before to after the target substance is melted. Further, the control unit 20 keeps the set temperatures of the sub-heater 44S within the second temperature range lower than the melting point of the target substance for the second given period from before to after the target substance is melted. Thus, after the target substance in the tank body portion 401 is sufficiently melted, the set temperatures of the third heater 443 and the fourth heater 444 as the sub-heater 44S can be increased to be higher than the melting point Tmp of the target substance.

In this embodiment, the control unit 20 sets the set temperatures of the third heater 443 and the fourth heater 444 as the sub-heater 44S to the temperatures higher than the melting point Tmp of target substance at the predetermined given time after the target substance is melted. As such, the set temperatures of the sub-heater 44S are increased at the predetermined given time, thereby facilitating control as compared to a case where the time when the set temperatures of the sub-heater 44S are increased is determined by calculation.

In this embodiment, the control unit 20 keeps the set temperature of the second heater 442 within the certain second temperature range from the elapsed time t1 to the elapsed time t2, which is part of the period when the set temperature of the first heater 441 is increased. By such temperature control, the target substance away from the communication portion 402 can be melted earlier than the target substance closer to the communication portion 402. This can more appropriately suppress passage of part of the target substance through the filter 48 before the target substance in the tank body portion 401 is completely melted.

In this embodiment, one part of the tank body portion 401 closer to the communication portion 402 and the communication portion 402 are arranged in the chamber 10, and the other part of the tank body portion 401 is exposed outside the chamber 10. The control unit 20 sets the set temperatures of the sub-heater 44S after the target substance in the tank body portion 401 is melted to the temperatures higher than the melting point Tmp of the target substance and lower than the set temperatures of the main heater 44M. The part of the tank body portion 401 exposed from the chamber 10 is exposed to an atmosphere, and the temperature thereof easily decreases. On the other hand, the communication portion 402 is located in the chamber 10, and thus a temperature decrease thereof is suppressed. Therefore, the control unit 20 controls the temperatures as described above, and thus the target substance in the tank 41 can have a nearly uniform temperature as compared to a case where the main heater 44M and the sub-heater 44S are controlled at the same temperature. The communication portion 402 with the temperature decrease being suppressed is set to the temperature higher than the melting point Tmp of the target substance, and the target substance in the tank 41 can have the nearly uniform temperature as described above. This can suppress the temperature of the target substance in the tank body portion 401 being lower than the melting point. This can suppress the target substance being insufficiently melted in the tank 41.

As a more specific example of the temperature control, in this embodiment, the control unit 20 sets the set temperature of the second heater 442 to the temperature higher than the set temperatures of the sub-heater 44S and lower than the set temperature of the first heater 441 at the elapsed time t7 after the target substance is melted. Thus, as compared to a case where the first heater 441 and the second heater 442 are controlled to the same temperature at and after the elapsed time t7, the target substance in the tank 41 can have a more nearly uniform temperature, thereby further suppressing the target substance being insufficiently melted in the tank 41.

In this embodiment, the control unit 20 sets the set temperature of the fourth heater 444 to the temperature higher than the melting point Tmp of the target substance and equal to or lower than the set temperature of the third heater 443 after the target substance in the tank body portion 401 is melted. The third heater 443 is located closer to the tank body portion 401 than the fourth heater 444, and thus an area of the communication portion 402 heated by the third heater 443 is easily influenced by heat from the main heater 44M. Thus, by the temperature control as described above, the target substance in the communication portion 402 can have a nearly uniform temperature as compared to a case where the set temperature of the fourth heater 444 is higher than the set temperature of the third heater 443.

5. Embodiment 2

5.1 Operation of Extreme Ultraviolet Light Generating Apparatus of Embodiment 2

Next, a configuration of an extreme ultraviolet light generating apparatus of Embodiment 2 will be described. Components similar to those described above are denoted by the same reference numerals, and overlapping descriptions are omitted unless otherwise stated. As in Embodiment 1, a configuration of an extreme ultraviolet light generating apparatus including a target supply device of this embodiment is similar to the configuration of the extreme ultraviolet light generating apparatus including the target supply device of the comparative example, and descriptions on the configuration of the extreme ultraviolet light generating apparatus including the target supply device of this embodiment are omitted.

Figure 7:
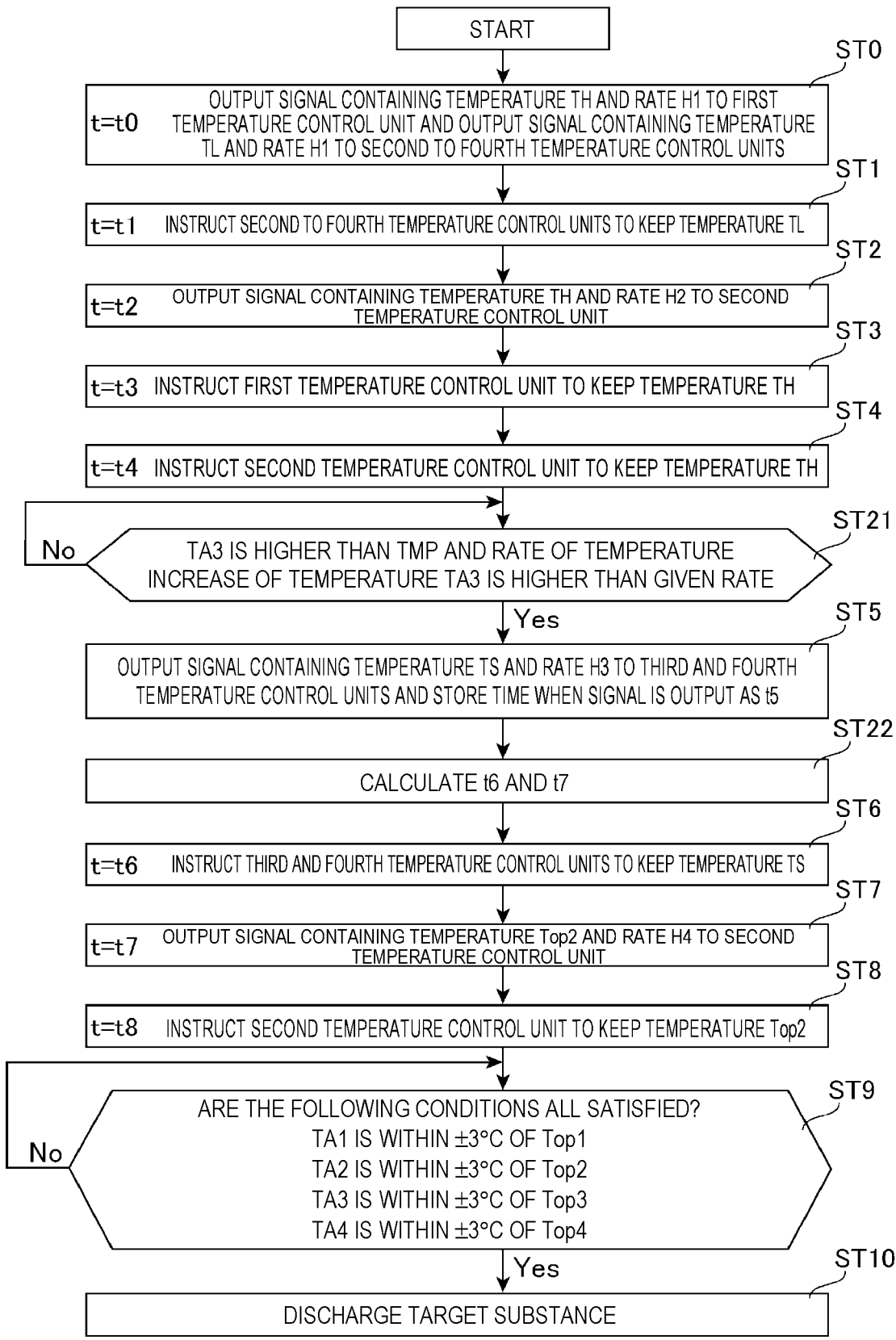
FIG. 7 is a flowchart of an operation of a control unit in Embodiment 2.
Figure 8:
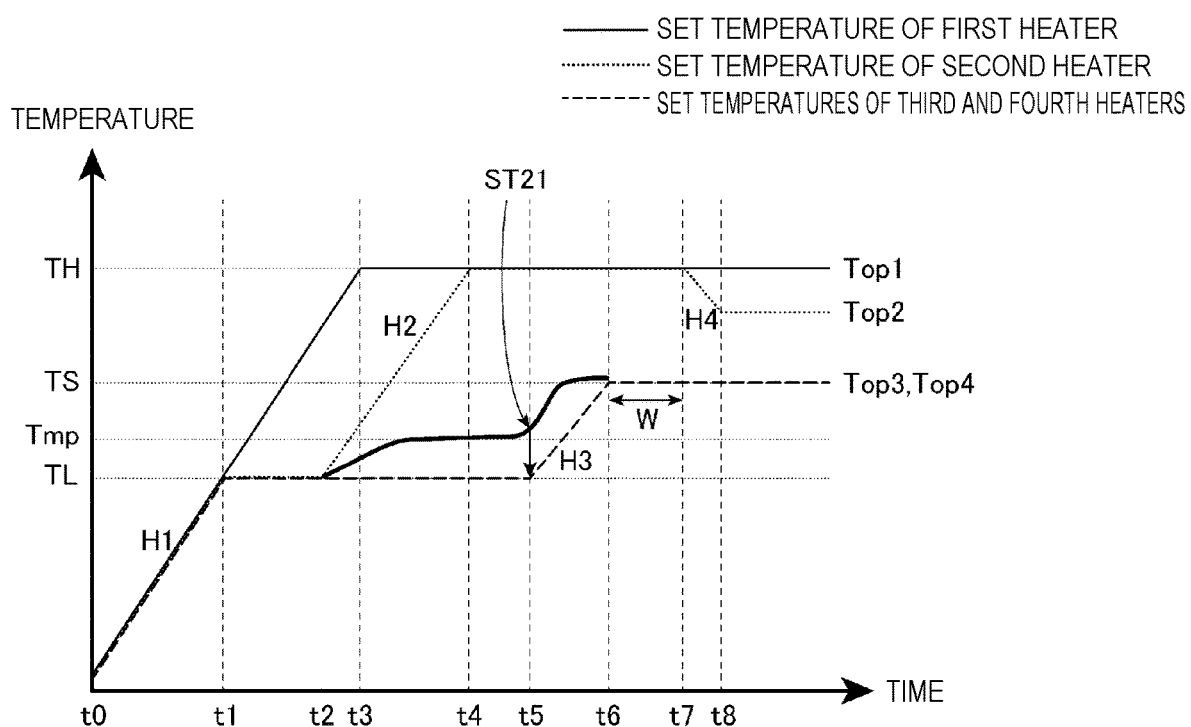
FIG. 8 diagrammatically shows set temperatures of a target supply device of Embodiment 2.

FIG. 7 is a flowchart of an operation of a control unit in this embodiment, and FIG. 8 diagrammatically shows set temperatures of the target supply device of this embodiment. As shown in FIG. 7, the target supply device 40 of this embodiment is mainly different from the target supply device 40 of Embodiment 1 in that a temperature control flow of the control unit 20 includes Step ST21 and Step ST22.

<Step ST0 to Step ST4>

In the target supply device 40 of this embodiment, the control unit 20 performs Step ST0 to Step ST4 similarly to Step ST0 to Step ST4 of Embodiment 1.

<Step ST21>

In Step ST2, the control unit 20 outputs a signal containing the temperature TH and the rate H2 of temperature increase to the second temperature control unit 462, and then makes two determinations as described below. One is a determination whether or not the temperature detected by the third temperature sensor 473 is higher than the melting point Tmp of the target substance. The other is a determination whether or not a rate of temperature increase of the temperature TA3 detected by the third temperature sensor 473 is higher than a given rate. The given rate is, for example, 0.3° C./min. In FIG. 8, the temperature TA3 detected by the third temperature sensor 473 from the elapsed time t2 to the elapsed time t6 is shown by a heavy line. As described in Embodiment 1, at the elapsed time t1, the control unit 20 keeps the set temperatures of the third heater 443 and the fourth heater 444 at the temperature TL, and this state continues after Step ST2. However, after the elapsed time t2, as described in Embodiment 1, the set temperature of the second heater 442 is increased at the rate H2 to be higher than the melting point Tmp of the target substance. When the set temperature of the second heater 442 becomes higher than the melting point Tmp of the target substance, heat of the target substance heated by the second heater 442 may be transferred to the communication portion 402, and the temperature of the communication portion 402 may become higher than the melting point Tmp of the target substance. When the temperature of the communication portion 402 becomes higher than the melting point Tmp of the target substance, the temperature TA3 detected by the third temperature sensor 473 becomes higher than the melting point Tmp.

While the target substance is melted from solid to liquid, the temperature of the target substance is almost constant. Thus, even if the heat of the target substance heated by the second heater 442 is transferred to the communication portion 402 as described above, the temperature TA3 detected by the third temperature sensor 473 is less likely to become higher than the melting point Tmp of the target substance, and tends to be almost constant. Then, when the temperature detected by the third temperature sensor 473 is higher than the melting point Tmp of the target substance, and the rate of temperature increase of the temperature TA3 detected by the third temperature sensor 473 is higher than the given rate, the control unit 20 goes to Step ST5. In FIG.

8, this timing is denoted by ST21 with an arrow. In this embodiment, the timing when the control unit 20 goes to Step ST5 may be prior to Step ST4.

<Step ST5>

In Step ST5 of Embodiment 1, at the predetermined elapsed time t5 after the elapsed time tm when the target substance is melted, the control unit 20 outputs the signal containing the temperature TS and the rate H3 of temperature increase to the third temperature control unit 463 and the fourth temperature control unit 464. In this embodiment, when the temperature TA3 detected by the third temperature sensor 473 is higher than the melting point Tmp of the target substance, and the rate of temperature increase of the temperature TA3 detected by the third temperature sensor 473 is higher than the given rate, the control unit 20 outputs the signal containing the temperature TS and the rate H3 of temperature increase to the third temperature control unit 463 and the fourth temperature control unit 464. Thus, an elapsed time when the control unit 20 outputs the signal containing the temperature TS and the rate H3 of temperature increase to the third temperature control unit 463 and the fourth temperature control unit 464 is not predetermined, which is different from Step ST5 of Embodiment 1. Specifically, the elapsed time t5 is not predetermined. When the control unit 20 outputs the signal, the third temperature control unit 463 controls the third heater power source 453 to apply current to the third heater 443 so that the rate of temperature increase of the third heater 443 becomes H3 as in Embodiment 1. The fourth temperature control unit 464 controls the fourth heater power source 454 to apply current to the fourth heater 444 so that the rate of temperature increase of the fourth heater 444 becomes H3 as in Embodiment 1. Then, the control unit 20 stores, as the elapsed time t5, the time when the control unit 20 outputs the signal containing the temperature TS and the rate H3 of temperature increase to the third temperature control unit 463 and the fourth temperature control unit 464.

In this embodiment, in Step ST21, when the temperature detected by the third temperature sensor 473 is higher than the melting point Tmp of the target substance, and the rate of temperature increase of the temperature detected by the third temperature sensor 473 is higher than the given rate, the control unit 20 goes to Step ST5. However, for example, in step ST21, as long as the temperature detected by the third temperature sensor 473 is higher than the melting point Tmp of the target substance, the control unit 20 may go to Step ST5 irrespective of the rate of temperature increase of the temperature detected by the third temperature sensor 473. However, it is preferable, in terms of suppression of malfunction, that the control unit 20 goes to Step ST5 when the temperature detected by the third temperature sensor 473 is higher than the melting point Tmp of the target substance, and the rate of temperature increase of the temperature detected by the third temperature sensor 473 is higher than the given rate as in this embodiment.

<Step ST22>

In this step, the control unit 20 calculates the elapsed time t6 from the elapsed time t5, the temperature TS, and the rate H3 of temperature increase. Also in this embodiment, the temperature Top3 and the temperature Top4 are equal to the temperature TS. The elapsed time t6 can be calculated by the following equation:

$$t6 = t5 + (TS - TL)/H3 \qquad (1)$$

Also in this step, the elapsed time t7 is calculated. The elapsed time t7 of this embodiment is a sum of the elapsed time t6 calculated as described above and a given waiting time W. The time W is a time before the temperature of the target substance is stabilized, and for example, 30 minutes.

<Step ST6 and Step ST7>

In the target supply device 40 of this embodiment, the control unit 20 performs Step ST6 and Step ST7 similarly to Step ST6 and Step ST7 of Embodiment 1. However, the elapsed time t6 and the elapsed time t7 when the control in Step ST6 and the control in Step ST7 are performed may be different from the elapsed time t6 and the elapsed time t7 of Embodiment 1.

<Step ST8>

In the target supply device 40 of this embodiment, the control unit 20 performs Step ST8 similarly to Step ST8 of Embodiment 1. However, as descried above, the elapsed time t7 when the control in Step ST7 is performed may be different from the elapsed time t7 of Embodiment 1. Thus, the elapsed time t8 when the control in Step ST8 of this embodiment is performed may be different from the elapsed time t8 of Embodiment 1.

<Step ST9 and Step ST10>

In the target supply device 40 of this embodiment, the control unit 20 performs Step ST9 and Step ST10 similarly to Step ST9 and Step ST10 of Embodiment 1. Then, when the droplet DL is formed, the droplet DL is irradiated with the pulsed laser beam 301, light including EUV light is radiated, and EUV light 101 is incident on the exposure device 200 as in Embodiment 1.

5.2 Effect

In this embodiment, effects are different from those in Embodiment 1 in the points described below. In this embodiment, the control unit 20 may increase the set temperatures of the third heater 443 and the fourth heater 444 as the sub-heater 44S to be higher than the melting point Tmp of the target substance when the temperature of the communication portion 402 becomes higher than the melting point Tmp of the target substance. This can suppress the set temperatures of the sub-heater 44S being increased to be higher than the melting point Tmp in a state where the unmelted target substance exists in the tank body portion 401 without exceeding the melting point Tmp. According to this embodiment, immediately after the target substance in the tank body portion 401 is completely melted, the set temperatures of the sub-heater 44S can be increased to be higher than the melting point Tmp. This can reduce an operation time before the target substance is discharged.

Merely with the temperature of the communication portion 402 being higher than the melting point Tmp of the target substance, part of the target substance may remain unmelted for some reason. Then, in this embodiment, the control unit 20 increases the set temperatures of the sub-heater 44S to be higher than the melting point Tmp of the target substance when the temperature of the communication portion 402 is higher than the melting point Tmp of the target substance and the rate of temperature increase of the communication portion 402 is higher than the given rate. The control unit 20 performs such control to suppress malfunction.

In the above description, the control unit 20 may be integrated with the first temperature control unit 461 to the fourth temperature control unit 464. Thus, as shown in FIG. 3, the control unit 20 and the first temperature control unit 461 to the fourth temperature control unit 464 may be regarded as a control unit 20S.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless otherwise stated. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device comprising:
a tank body portion holding a target substance;
a communication portion connected to the tank body portion and including a filter configured to filter the target substance in a melted state and a nozzle configured to discharge the target substance having passed through the filter;
a main heater configured to heat the tank body portion;
a sub-heater configured to heat the communication portion; and
a control unit,
the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

2. The target supply device according to claim 1, wherein the control unit keeps the set temperature of the main heater within a first temperature range higher than the melting point of the target substance for a first given period from before to after the target substance is melted, and keeps the set temperature of the sub-heater within a second temperature range lower than the melting point of the target substance for a second given period from before to after the target substance is melted.

3. The target supply device according to claim 2, wherein the target substance is tin, and
the first temperature range is 280° C. to 320° C.

4. The target supply device according to claim 2, wherein the target substance is tin, and
the second temperature range is 200° C. to 220° C.

5. The target supply device according to claim 1, wherein the control unit increases the set temperature of the sub-heater to be higher than the melting point of the target substance at a predetermined given time from when the sub-heater starts heating.

6. The target supply device according to claim 1, wherein the control unit increases the set temperature of the sub-heater to be higher than the melting point of the target substance when a temperature of the communication portion becomes higher than the melting point of the target substance.

7. The target supply device according to claim 6, wherein the control unit increases the set temperature of the sub-heater to be higher than the melting point of the target substance when the temperature of the communication portion is higher than the melting point of the target substance and a rate of temperature increase of the communication portion is higher than a given rate.

8. The target supply device according to claim 1, wherein the main heater includes a first heater and a second heater arranged closer to the communication portion than the first heater, and
the control unit keeps a set temperature of the second heater within a certain temperature range during increasing a set temperature of the first heater.

9. The target supply device according to claim 1, wherein one part of the tank body portion closer to the communication portion and the communication portion are arranged in the chamber, and the other part of the tank body portion is exposed outside the chamber, and
the control unit sets the set temperature of the sub-heater after the target substance in the tank body portion is melted to a temperature higher than the melting point of the target substance and lower than the set temperature of the main heater.

10. The target supply device according to claim 9, wherein the main heater includes a first heater and a second heater arranged closer to the communication portion than the first heater, and
the control unit sets a set temperature of the second heater to a temperature higher than the set temperature of the sub-heater and lower than a set temperature of the first heater after the target substance is melted.

11. The target supply device according to claim 10, wherein
the target substance is tin, and
the control unit sets, to 280° C. to 320° C., the set temperature of the first heater after the target substance is melted.

12. The target supply device according to claim 10, wherein
the target substance is tin, and
the control unit sets, to 270° C. to 310° C., the set temperature of the second heater after the target substance is melted.

13. The target supply device according to claim 9, wherein
the sub-heater includes a third heater and a fourth heater arranged closer to the nozzle than the third heater, and
the control unit sets a set temperature of the fourth heater to a temperature higher than the melting point of the target substance and lower than a set temperature of the third heater after the target substance in the tank body portion is melted.

14. The target supply device according to claim 13, wherein
the target substance is tin, and
the control unit sets, to 240° C. to 270° C., the set temperatures of the third heater and the fourth heater after the target substance in the tank body portion is melted.

15. An extreme ultraviolet light generating apparatus comprising:
a chamber in which a target substance supplied to an internal space thereof is irradiated with a laser beam to generate extreme ultraviolet light; and
a target supply device configured to supply the target substance into the chamber,
the target supply device including
a tank body portion holding the target substance,
a communication portion connected to the tank body portion and including a filter configured to filter the target substance in a melted state and a nozzle configured to discharge the target substance having passed through the filter, a main heater configured to heat the tank body portion, a sub-heater configured to heat the communication portion, and a control unit, the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

16. An electronic device manufacturing method comprising:

generating extreme ultraviolet light with an extreme ultraviolet light generating apparatus;

outputting the extreme ultraviolet light to an exposure device; and exposing the extreme ultraviolet light onto a photosensitive substrate within the exposure device to manufacture an electronic device, the extreme ultraviolet light generating apparatus including a chamber in which a target substance supplied to an internal space thereof is irradiated with a laser beam to generate extreme ultraviolet light, and a target supply device configured to supply the target substance into the chamber, the target supply device including a tank body portion holding the target substance, a communication portion connected to the tank body portion and including a filter configured to filter the target substance in a melted state and a nozzle configured to discharge the target substance having passed through the filter, a main heater configured to heat the tank body portion, a sub-heater configured to heat the communication portion, and a control unit, the control unit being configured to set the main heater to a temperature higher than a melting point of the target substance before the target substance is melted, to set the sub-heater to a temperature lower than the melting point of the target substance until the target substance in the tank body portion is melted, and to set the sub-heater to a temperature higher than the melting point of the target substance after the target substance in the tank body portion is melted.

* * * * *